United States Patent [19]

Kasper

[11] Patent Number: 4,744,105

[45] Date of Patent: May 10, 1988

[54] RECEIVER USING OPTICAL FEEDBACK

[75] Inventor: Bryon L. Kasper, Lincroft, N.J.

[73] Assignee: American Telephone and Telegraph Company, AT&T Bell Laboratories, Murray Hill, N.J.

[21] Appl. No.: 887,356

[22] Filed: Jul. 21, 1986

[51] Int. Cl.[4] .............................................. H04B 9/00
[52] U.S. Cl. .................................................. 455/619
[58] Field of Search ................... 455/619; 250/214 A, 250/214 AG; 330/59, 308

[56] References Cited

U.S. PATENT DOCUMENTS 3,972,004  7/1976  Libs ........................................ 330/59

FOREIGN PATENT DOCUMENTS 203020A  9/1978  United Kingdom ................ 330/308

OTHER PUBLICATIONS

IBM Tech. Disclosure Bulletin, Vol. 23, No. 8, Jan. 81, "Low Noise Optical Receiver", Haas and Stilwell.

Primary Examiner—Robert L. Griffin
Assistant Examiner—Leslie Van Beek
Attorney, Agent, or Firm—Richard D. Laumann

[57] ABSTRACT

A receiver for optical signals using optical feedback between the output and input terminals of a transimpedance amplifier.

4 Claims, 1 Drawing Sheet

RECEIVER USING OPTICAL FEEDBACK

TECHNICAL FIELD

This invention relates generally to the field of optical receivers and particularly to such receivers using feedback.

BACKGROUND OF THE INVENTION

Receivers for optical signals are useful in a wide variety of applications, including optical communications systems. As presently contemplated, such systems typically have a light source and receiver optically coupled to each other by means of an optical fiber. Information is transmitted as variations in a characteristic, e.g., intensity, of the optical radiation, and the rate of variation in a digital transmission system is referred to as the bit rate. Other characteristics, such as frequency, of the optical radiation might be varied. The receiver detects the incoming optical signal and either regenerates the optical signal or converts it to an electrical signal.

Of course, receivers should have high sensitivity. They must, however, satisfy other requirements such as dynamic range. Additionally, typical optical communication systems may operate within a wide range of bit rates. A common approach to achieving high sensitivity and wide bandwidth for low bit rate, that is, several Mbit/sec, applications, is to use a transimpedance amplifier. This type of amplifier has a resistance to provide electrical feedback between the amplifier output and input, i.e., across the amplifier. In a typical configuration, the receiver uses a Si JFET amplifier and a P-I-N photodetector with less than 100 pA dark current. With this configuration, the feedback resistance must be greater than 500 megohms so that the Johnson noise from the resistance is less than the amplifier noise if it is assumed that the amplifier has a 1 MHz bandwidth.

As might be appreciated, such a large resistance causes several problems. For example, the dynamic range of the receiver is extremely limited because very large amplifier output voltage swings are needed for any appreciable current flow through the feedback resistance. For example, a 1 $\mu W$ input for the values assumed above will require a 500 volt swing. Additionally, the bandwidth is limited because any parasitic capacitance in parallel with the feedback resistance produces a very large RC time constant. It can be shown that for the assumed 1 MHz bandwidth, the parasitic capacitance must be less than 0.0003 pF.

In addition to their use in communications systems, optical receivers are used in many types of instruments such as optical time domain reflectometers. This type of instrument is used to analyze many optical fiber characteristics such as distances to splices, etc. Additionally, optical receivers are often used to detect the Cerenkov radiation from elementary particles.

SUMMARY OF THE INVENTION

A receiver comprising optical feedback between the amplifier output and amplifier input eliminates many of the problems associated with the feedback resistance in a transimpedance amplifier while providing the necessary current feedback to achieve wide dynamic range. In one embodiment, the receiver comprises a first photodetector, an amplifier having input and output terminals, said input terminal being connected to said photodetector, and a light source, said light source being connected to said output terminal. Additionally, there is an optical path between the light source and the photodetector, i.e., the light source and photodetector are optically coupled to each other such that the negative feedback via optical coupling is established around the amplifier. The photodetector is conveniently referred to as a feedback detector. In a preferred embodiment, the receiver further comprises a second photodetector connected to the amplifier input terminal. The photodetectors generate positive and negative input signals. The second photodetector, conveniently referred to as the signal detector, receives the incoming optical signal. During receiver operation, negative feedback insures that the optical level at the feedback detector is large enough so that the photocurrent in the feedback detector balances the photocurrent in the signal detector. More generally, the receiver will operate with any current source, i.e., the signal photodetector may be replaced by another type of current source. Thus, the receiver may be used with incoming electrical, as well as optical, signals.

BRIEF DESCRIPTION OF THE DRAWING

In all of the figures, identical numerals represent identical elements.

DETAILED DESCRIPTION

Figure 1:
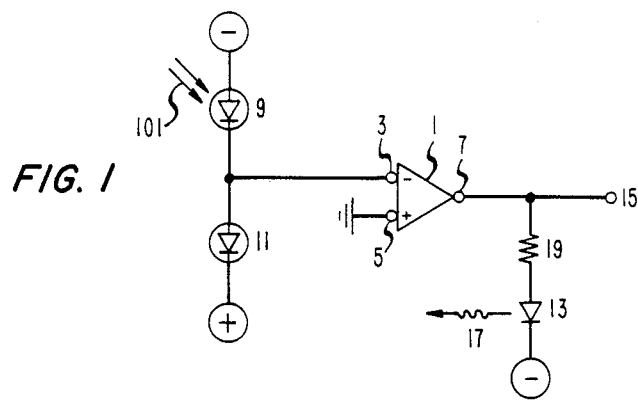
FIG. 1 is a schematic representation of one embodiment of an optical receiver according to this invention.

An exemplary embodiment of an optical receiver according to this invention is schematically represented in FIG. 1. Depicted are operational amplifier 1 which has two input terminals 3 and 5 and an output terminal 7. Connected to one of the input terminals, for example, 3 are two photodetectors 9 and 11. The photodetectors depicted are p-i-n photodiodes, although it will be readily appreciated that other types of photodetectors may be used. The photodetectors are biased as indicated. The incoming optical signal, depicted as 101, is incident on photodetector 9. The input terminal 5 is connected to ground. Connected to the output terminal 7 through series resistance 19 is light source 13. This light source is, for example, a light emitting diode or semiconductor laser. It is biased as indicated. The electrical output signal is taken from terminal 15. Series resistance 19 is required to increase the signal output voltage at terminal 15, as the light source 13 is a forward biased diode and will tend to maintain a constant voltage drop over a wide range of input current and light output.

There is an optical feedback path 17 between light source 13 and photodetector 11. The feedback path, which optically couples the two elements, may be, for example, free space or an optical waveguide. The latter might be, for example, an optical fiber. Waveguides, including optical fibers, are well known to those skilled in the art and need not be described in more detail. Also, use of a lens or integrated optics are contemplated. If a lens were used, most of the optical path would be in free space. The optical path could include an optical alternator is some embodiments.

The spacing between the light source and photodetector is generally not critical. However, the two elements should not be so far apart that the time delay is long nor should they be so close that there is substantial electrical coupling between the two elements. Choice of an appropriate distance will be readily made by those skilled in the art.

There is a performance penalty which arises in this embodiment due to a small increase in the input capacitance because of the second photodetector as well as an increase in the total dark current due to the second photodetector. However, the resultant performance penalty is small relative to the performance advantages outlined below.

The wavelength that the light source operates at is not critical provided that the photodetector is chosen so that it is sensitive to the light source wavelength. For example, a Si photodetector can be used with a 0.8 μm light source. Devices at 0.8 μm wavelength have the advantages of low cost, low detector dark current, and high source efficiency. Also, element 13 might be an electrically controlled optical intensity modulator which controls the light intensity from a continuously operating external light source. Element 13 might also comprise a combination of an intensity modulated light source and an external optical intensity modulator. In general, any electrically controlled light source can be employed.

The receiver bandwidth is determined by the amplifier gain, that is, the higher the gain, the greater the bandwidth.

The optical feedback coupling eliminates the feedback resistance as a noise source and the parasitic capacitance as a bandwidth limitation. It also insures that the amplifier output voltage swing is small resulting in a wide dynamic range. It is contemplated that a range of 30 db or more can be easily achieved.

The light source desirably has several characteristics. In particular, the light source should be linear for very low optical power, that is, nanowatt levels. The term linear is used to mean that there is a linear relationship between the optical power and the applied bias. This requirement is generally more stringent for analog systems than it is for digital systems. It will be appreciated by those skilled in the art that there are some applications in which nonlinearity is desirable as it may, for example, increase the dynamic range by preventing hard saturation.

Figure 2:
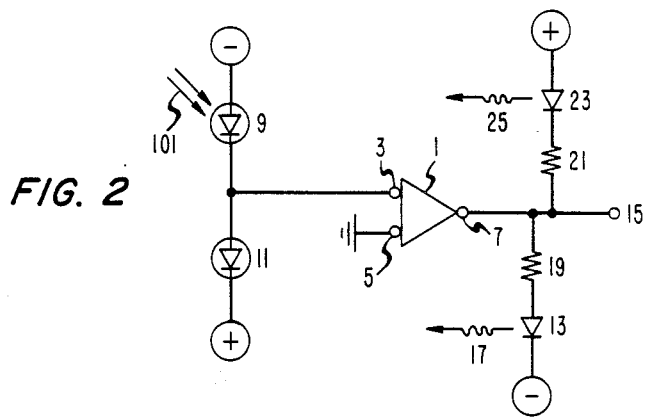
FIG. 2 is a schematic representation of still another embodiment of an optical receiver according to this invention.

Other embodiments are possible and may be preferred in some circumstances. One such embodiment using two optical feedback paths is depicted in FIG. 2. This embodiment has a second light source 23 which is optically coupled to photodetector 9 by means of optical path 25. This embodiment is advantageously employed in a balanced detector used in a coherent system. Such a detector is sensitive to the difference in the light levels incident on the two photodetectors. This embodiment may also have advantages of increased linearity for detection of extremely weak optical signals as, for example, in an optical time domain reflectometer.

Figure 3:
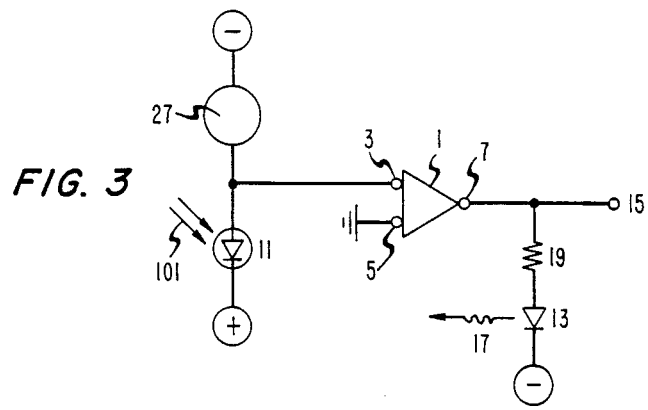
FIG. 3 is a schematic representation of yet another embodiment of an optical receiver according to this invention.

In another embodiment, only one photodetector, which is sensitive to both the incoming optical signal as well as the feedback signal, is used. This embodiment is depicted in FIG. 3 and, in addition to the elements previously described, it also uses current source 27. This source is needed as a load for the detector photocurrent. The current source could be a very large resistance and voltage source or, alternatively, a standard semiconductor, that is, transistor circuit. In order to have a wide dynamic range while retaining high sensitivity at low signal levels, the current from the current source might have to be periodically adjusted.

Other embodiments will be readily thought of by those skilled in the art. For example, optical feedback might be used in an otherwise electrical amplifier. The amplifier would receive an electrical signal and amplify it using optical feedback. An appropriate configuration is shown in FIG. 1 with the incoming optical signal eliminated. Additionally, the top diode, i.e., photodetector 9, could be any current source. Additionally, an inverting amplifier is depicted. It will be readily appreciated by those skilled in the art that noninverting amplifiers could be used with appropriate changes in the polarities of the other circuit components. Furthermore, the amplifier may have only one input terminal.

Another embodiment replaces one of the photodetectors with an optically sensitive field-effect transistor that also serves as the input transistor of the electronic amplifier. Optical illumination then causes gate current to flow across the reverse-biased gate-channel junction of the FET, and this gate current replaces the photocurrent of one of the previously described photodetectors. This implementation requires only one photodetector and as such does not incur the penalties of extra capacitance and dark current associated with two photodetectors. As the optical coupling efficiency to the feedback detector is less critical than that to the signal detector, the FET could most advantageously be used as the feedback detector.

What is claimed is:

1. A receiver comprising an amplifier having an input terminal and an output terminal, a current source being connected to said input terminal, a first photodetector being connected to said input terminal, a first light source being connected to said output terminal, a first optical path coupling said first photodetector and said first light source, said current source comprising a second photodetector;
   a second light source connected to said output terminal; and
   a second optical path, said second path optically coupling said second light source and said second photodetector.

2. A receiver as recited in claim 1 in which said first optical path comprises an optical waveguide.

3. A receiver as recited in claim 2 in which said optical waveguide comprises an optical fiber.

4. A receiver as recited in claim 3 in which said second path comprises an optical waveguide.

* * * * *